(12) United States Patent
Jung et al.

(10) Patent No.: US 6,735,137 B2
(45) Date of Patent: May 11, 2004

(54) SEMICONDUCTOR MEMORY DEVICE EMPLOYING TEMPERATURE DETECTION CIRCUIT

(75) Inventors: In-Chul Jung, Ichon-shi (KR); Sun-Seok Yang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/317,544

(22) Filed: Dec. 12, 2002

(65) Prior Publication Data

US 2003/0107936 A1 Jun. 12, 2003

(30) Foreign Application Priority Data

Dec. 12, 2001 (KR) .......................................... 2001-78651
Mar. 11, 2002 (KR) ................................. 10-2002-0012865

(51) Int. Cl.[7] ................................................ G11C 7/04
(52) U.S. Cl. ...................... 365/211; 365/194; 365/203
(58) Field of Search ................................ 365/211, 191, 365/189.08, 194, 203, 189.09

(56) References Cited

U.S. PATENT DOCUMENTS

| 3,983,415 | A | | 9/1976 | Nichols |
|---|---|---|---|---|
| 4,138,616 | A | | 2/1979 | Turner |
| 4,618,788 | A | | 10/1986 | Backes et al. |
| 6,055,204 | A | | 4/2000 | Bosshart |
| 6,373,313 | B1 | * | 4/2002 | Hishiyama ................... 327/276 |
| 6,560,164 | B2 | * | 5/2003 | Kawai et al. ................ 365/233 |
| 2001/0021953 | A1 | * | 9/2001 | Nakashima ..................... 710/5 |

FOREIGN PATENT DOCUMENTS

JP          58-194424          11/1983

* cited by examiner

Primary Examiner—Thong Q. Le
(74) Attorney, Agent, or Firm—Marshall, Gerstein & Borun LLP

(57) ABSTRACT

A temperature detection circuit is provided. A first delay unit has a first delay time that varies based on a temperature. The first delay unit receives a reference signal and generates a first delayed reference signal. A second delay unit has a second delay time that varies based on the temperature, wherein the second delay time varies less than the first delay time for a given temperature variance. The second delay unit to receives the reference signal and generates a second delayed reference signal. A temperature detecting unit receives the first and second delayed reference signals and generates a temperature detection signal based on the first and second delayed reference signals.

19 Claims, 11 Drawing Sheets

HIGH TEMPERATURE

LOW TEMPERATURE

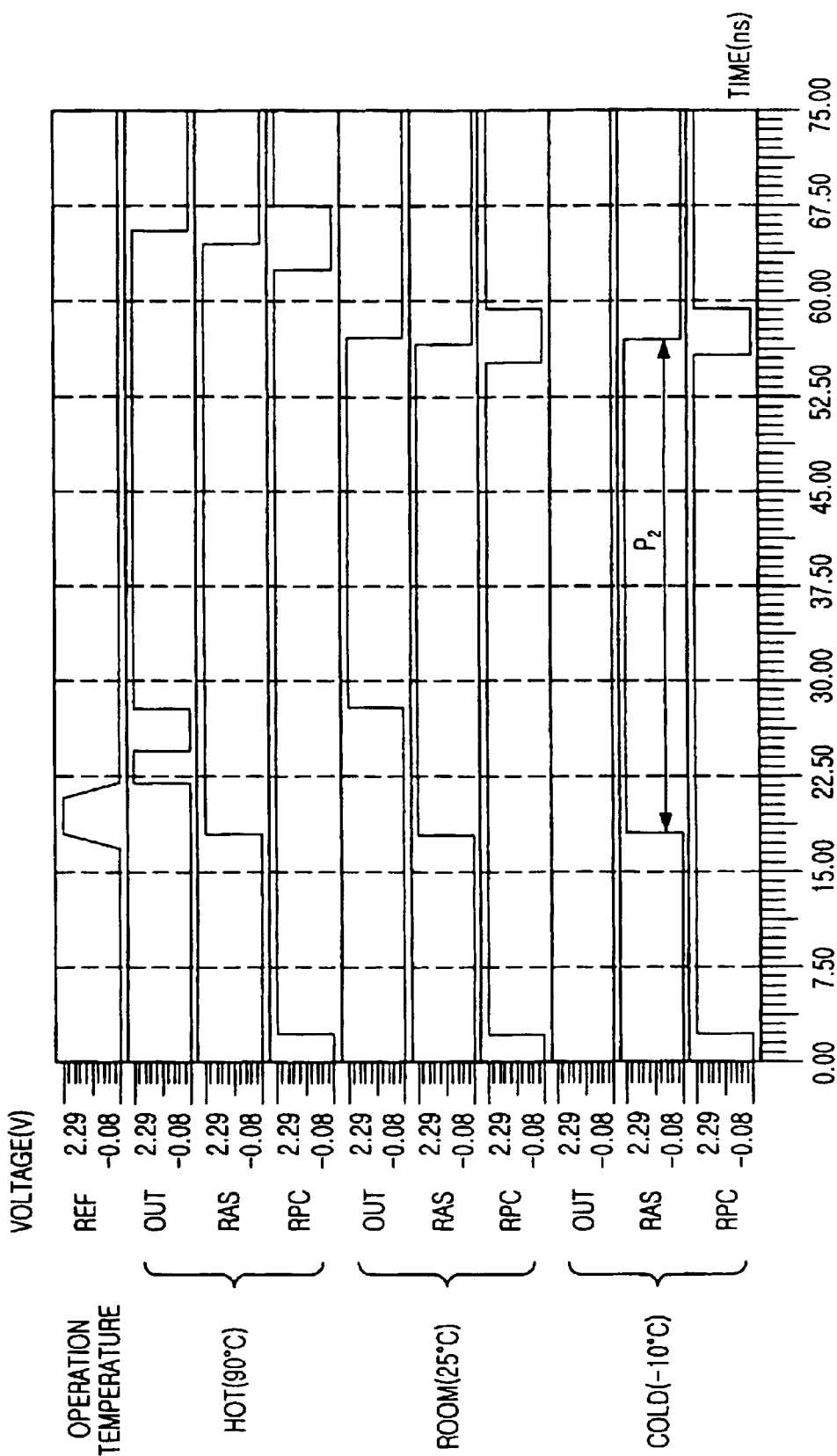

SEMICONDUCTOR MEMORY DEVICE EMPLOYING TEMPERATURE DETECTION CIRCUIT

FIELD OF THE DISCLOSURE

The present disclosure relates to semiconductor devices; and, more particularly, to a temperature detection circuit that may be employed in a semiconductor memory device for detecting an operational temperature of the semiconductor memory device.

DESCRIPTION OF RELATED ART

In general, operational features of a semiconductor device such as a transistor may substantially vary depending on an ambient temperature of the semiconductor device. For example, the ambient temperature may affect conductance of a transistor, a breakdown voltage of a gate oxide film, etc.

Semiconductor devices such as memory devices often require very accurate timing control. Operation of such devices may remarkably change with temperature. Therefore, if effects of temperature on operation are not considered, there may occur operational errors in the device, which may cause malfunctions in computer systems employing the device.

For a dynamic random access memory (DRAM), a refresh operation is periodically performed to preserve data stored in memory cells. A time between which a cell should be refreshed (the required refresh time) may strongly depend on an ambient or operational temperature. For example, the higher the temperature becomes, the faster the data may be lost.

However, since a conventional DRAM did not have a circuit for detecting an internal temperature thereof, the refresh operation has typically been executed in a refresh period that is predetermined based on an assumed worst case thermal condition, e.g., an assumed worst case temperature.

Referring to FIG. 1, there is shown a block diagram of a part of a conventional memory device including no temperature detecting circuit, wherein, in particular, the conventional memory device generates a row address strobe (RAS) signal.

The conventional memory device includes a RAS signal generator 10 that generates the RAS signal in response to a reference signal REF and a feedback signal RPC. The device also includes a precharge period signal generator 20 that generates the feedback signal RPC.

FIG. 2 provides a timing diagram illustrating an operation of the conventional memory device shown in FIG. 1.

With reference to FIGS. 1 and 2, the operation of the conventional memory device will be described.

The RAS signal generator 10 generates the RAS signal, which has a high state during a RAS enable period tRAS and a low state during a precharge period tRP. The RAS signal goes to the high state in response to the REF signal going to a high state.

The precharge period signal generator 20 generates the feedback signal RPC, which is coupled to one input of the RAS signal generator 10. The feedback signal RPC has a low state after a predetermined time from the rising edge of the RAS signal as shown in $T_2$ of FIG. 2, wherein the predetermined time may be determined by the assumed worst case thermal condition.

In response to the feedback signal RPC, the RAS signal from the RAS signal generator 10 changes from the high state to the low state shown in $T_1$ of FIG. 2. Typically, the memory device performs a sensing operation during the period tRAS, and performs a precharge operation during the precharge period tRP.

As discussed previously, the memory device may have a required refresh time that varies depending on the ambient or the operational temperature. For instance, if the operational temperature of the device is low, a contact resistance of a bit-line sense amplifier (BLSA) of the device may increase and, thus, a sensing operation of the BLSA may take a longer time.

Additionally, if the operational temperature of the device is high, the operational speed of the precharge period signal generator 20 may increase. This may cause the feedback signal RPC to go to its low state in a shorter amount of time, which causes the period tRAS to shorten. Further, the precharge period tRP may be increased, and occur sooner after the start of the period tRAS. Further, this may cause the device to change from the sensing operation to the precharge operation prematurely, adversely affecting the operational stability of the device.

SUMMARY OF THE DISCLOSURE

In accordance with one embodiment, a temperature detection circuit is provided. The temperature detection circuit comprises a first delay unit having a first delay time that varies based on a temperature, the first delay unit to receive a reference signal and to generate a first delayed reference signal. The temperature detection circuit also comprises a second delay unit having a second delay time that varies based on the temperature, wherein the second delay time varies less than the first delay time for a given temperature variance, the second delay unit to receive the reference signal and to generate a second delayed reference signal. Additionally, the temperature detection circuit comprises a temperature detecting unit to receive the first and second delayed reference signals and to generate a temperature detection signal based on the first and second delayed reference signals.

Another embodiment of a temperature detection circuit is also provided. The temperature detection circuit includes a first delay unit having a first delay time that varies based on a temperature, the first delay unit to receive a reference signal and to generate a first delayed reference signal. The temperature detection circuit also includes a second delay unit having a second delay time that varies based on the temperature, the second delay unit to receive the reference signal and to generate a second delayed reference signal, wherein the second delay time is shorter than the first delay time, and wherein a variation in the second delay time for a given temperature variation is substantially the same as a variation in the first delay time for the given temperature variation. The temperature detection circuit additionally includes a third delay unit having a third delay time, that varies based on the temperature, the third delay unit to receive the reference signal and to generate a third delayed reference signal, wherein a variation in the third delay time for the given temperature variation is different than the variation in the first delay time for the given temperature variation. The temperature detection circuit further includes a fourth delay unit having a fourth delay time that varies based on the temperature, the fourth delay unit to receive the reference signal and to generate a fourth delayed reference signal, wherein the fourth delay time is shorter than the third delay time, and wherein a variation in the fourth delay time for the given temperature variation is substantially the same as the variation in the third delay time for the given temperature variation. The temperature detection circuit still further includes a temperature detecting unit for receiving the first, second, third and fourth delayed reference signals to generate a temperature detection signal based on the first to fourth delayed reference signals.

In accordance another aspect, a semiconductor memory device comprising a temperature detection circuit to generate a temperature detection signal is provided. The temperature detection circuit comprises a first delay unit having a first delay time that varies based on a temperature, the first delay unit to receive a reference signal and to generate a first delayed reference signal. The temperature detection circuit additionally comprises a second delay unit having a second delay time that varies based on the temperature, the second delay unit to receive a reference signal and to generate a second delayed reference signal, wherein the second delay time varies less than the first delay time for a given temperature variance. The temperature detection circuit further comprises a temperature detecting circuit to receive the first and second delayed reference signals and to generate the temperature detection signal based on the first and second delayed reference signals.

BRIEF DESCRIPTION OF THE DRAWINGS

FIG. 14 is a simulation result of the operation of the semiconductor memory device in FIG. 3 when it employs a temperature detecting circuit.

DETAILED DESCRIPTION

Figure 1:
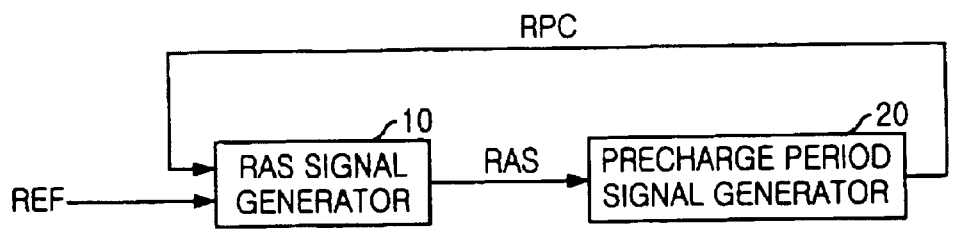
FIG. 1 is a schematic block diagram of a part of a conventional memory device without a temperature detecting circuit.
Figure 2:
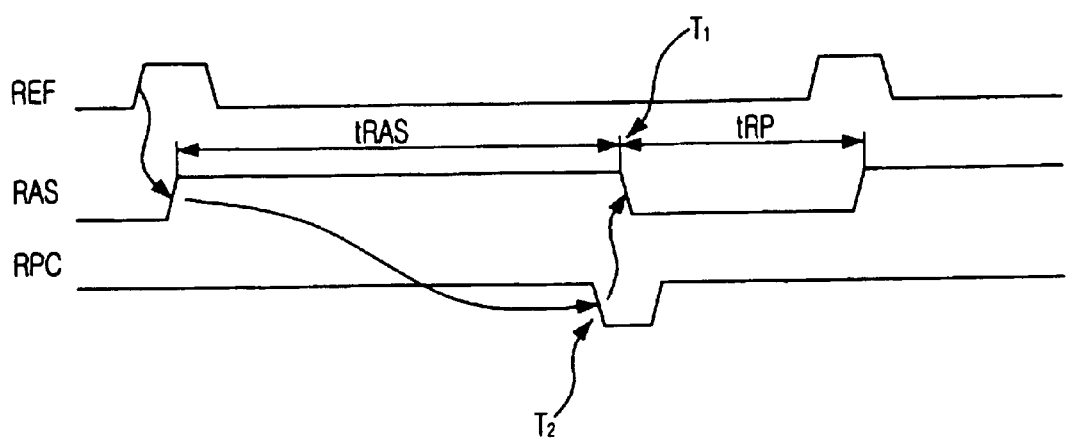
FIG. 2 is a timing diagram illustrating an operation of the conventional memory device shown in FIG. 1.
Figure 3:
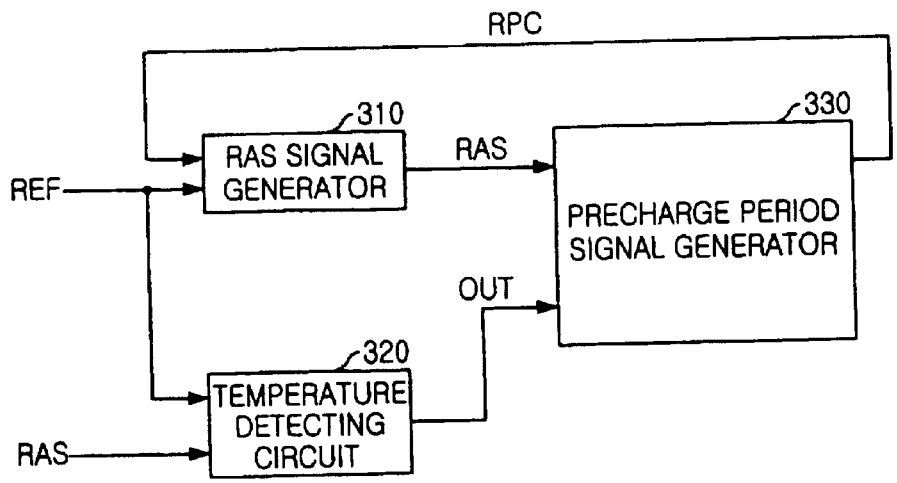
FIG. 3 is a block diagram of a semiconductor memory device employing an example temperature detecting circuit.

FIG. 3 is a block diagram of an example semiconductor memory device with a temperature detection circuit.

The semiconductor memory device includes a RAS signal generator 310, a temperature detection circuit 320 and a precharge period signal generator 330. The RAS signal generator 310 generates a RAS signal based on a reference signal REF and a feedback signal RPC. The RAS signal generator 310 is coupled to the precharge period signal generator 330, which generates the feedback signal RPC. The temperature detection circuit 320 receives the RAS signal and the reference signal REF and generates a control signal OUT, which may be provided to the precharge period signal generator 330.

Figure 4:
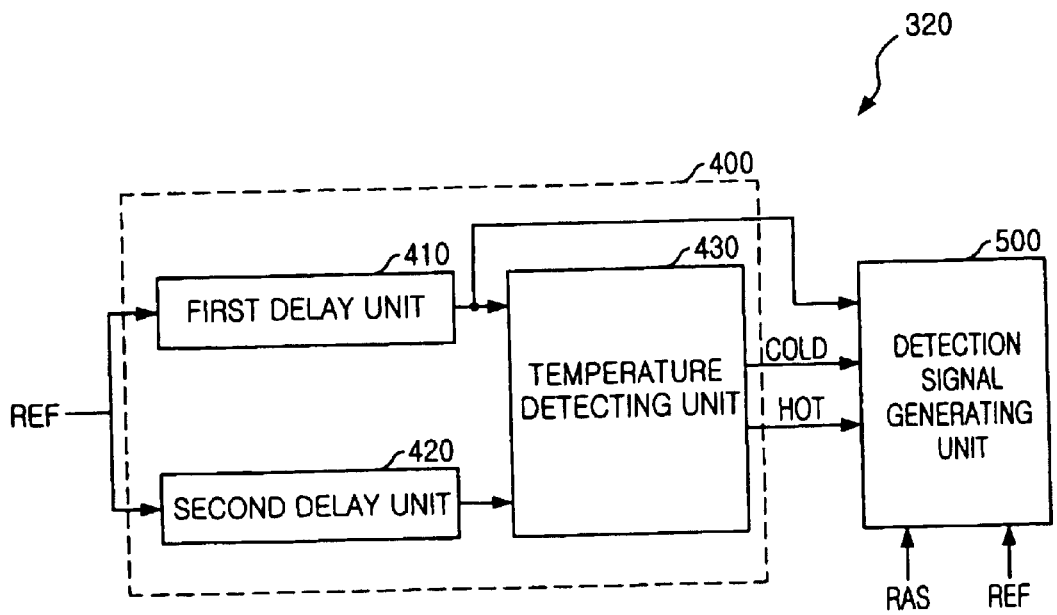
FIG. 4 is a block diagram of an example temperature detecting circuit.

Referring to FIG. 4, there is shown a block diagram of an example temperature detection circuit 320.

The temperature detection circuit 320 includes a temperature detector 400 and a detection signal generating unit 500. The temperature detector 400 includes a first delay unit 410, a second delay unit 420 and a temperature detecting unit 430. The first delay unit 410, whose delay time may vary depending on an operational or an ambient temperature (hereinafter referred to as the "ambient temperature") receives the reference signal REF. The second delay unit 420, whose delay time may very differently (e.g., may vary less) than that of the first delay unit 410, also receives the reference signal REF. The temperature detecting unit 430 detects the ambient temperature by using signals generated by the first and the second delay units 410 and 420. The detection signal generating unit 500 generates the control signal OUT based on temperature detection signals COLD and HOT generated by the temperature detecting unit 430, the RAS signal and the reference signal REF. The temperature detection signal COLD is activated when an ambient temperature is lower than a predetermined temperature, which may be defined when a semiconductor device is fabricated, and the temperature detection signal HOT is activated when the ambient temperature is higher than the predetermined temperature.

Figure 5:
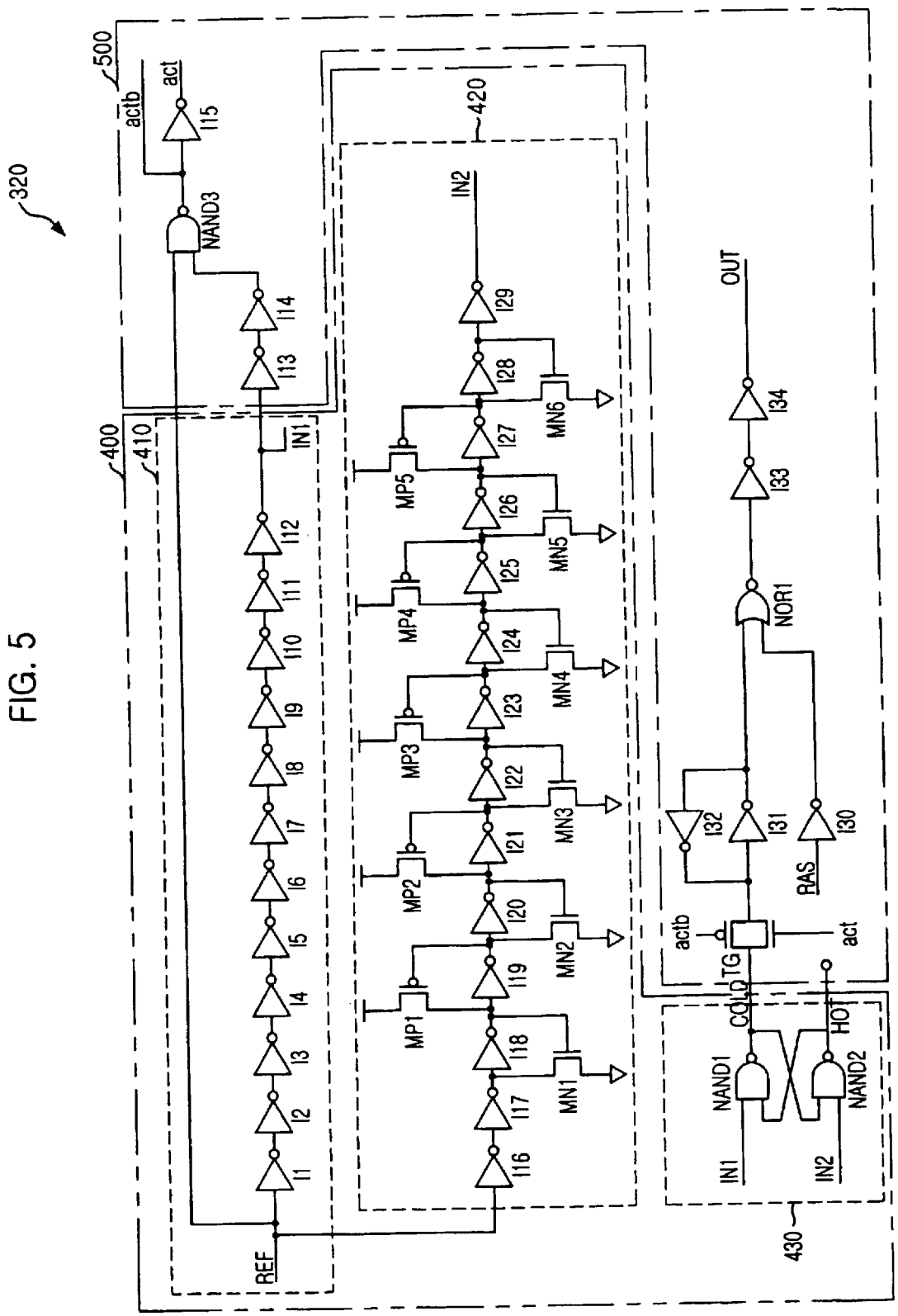
FIG. 5 is a circuit diagram of an example temperature detecting circuit.

The temperature detection circuit 320 detects the ambient temperature based on a difference between delay times of signals generated by the first and the second delay units 410 and 420, wherein each delay time of the first and second delay units 410 and 420 varies differently in response to different ambient temperatures FIG. 5 is a circuit diagram of an example temperature detection circuit 320 of FIG. 4.

The temperature detection circuit 320 includes a first delay unit 410 which receives the reference signal REF and generates a first delayed reference signal IN1 and whose delay time increases with increasing temperature. The temperature detection circuit 320 also includes a second delay unit 420 which receives the reference signal REF and generates a second delayed reference signal IN2 whose delay time increases with increasing temperature, but less than that of the first delayed reference signal IN1. The temperature detection circuit 320 further includes a temperature detecting unit 430 that generates the temperature detection signals COLD and HOT based on the delayed reference signals IN1 and IN2. Additionally included is a detection signal generating unit 500 that generates the control signal OUT.

The first delay unit 410 comprises a plurality of inverters I1 to I12 coupled in series. The second delay unit 420 comprises a plurality of inverters I16 to I29 coupled in series and a plurality of MOS transistors MP1 to MP5 and MN1 to MN6, wherein each MOS transistor couples an output of one inverter to a supply voltage VDD or a ground, and whose gate is coupled to an output of the next inverter. The delay time of the first delay unit 410 changes more than that of the second delay unit 420 for a given change in temperature.

The temperature detecting unit 430 includes a first NAND gate NAND1 and a second NAND gate NAND2, which receive the delayed reference signals IN1 and IN2, respectively, as one input and whose outputs are provided to the NAND gates NAND2 and NAND 1, respectively, as the other input.

Because the semiconductor memory device is generally fabricated considering an assumed worst case thermal condition, e.g., a high temperature, an example in which the output signal COLD of the temperature detecting unit 430, which is activated for a low ambient temperature, is used will be described.

The detection signal generating unit 500 includes inverters I13 and I14 receiving the first delayed reference signal IN1, a third NAND gate NAND3 receiving the reference signal REF and an output signal of the inverter I14 and generating a first control signal actb, an inverter I15 for generating a second control signal act by inverting the first control signal actb. The detection signal generating unit 500 further includes a transfer gate TG that transfers the COLD signal in response to the first and second control signals act and actb, a latch comprising inverters I31 and I32 receiving signals transferred through the transfer gate TG, a first NOR gate NOR1 for receiving an output signal of the inverter I31 and an inverted RAS signal from an inverter I30, and inverters I33 and I34 receiving an output of the first NOR gate NOR1 and generating the control signal OUT, which may be provided to the precharge period signal generator 330.

Figure 6:
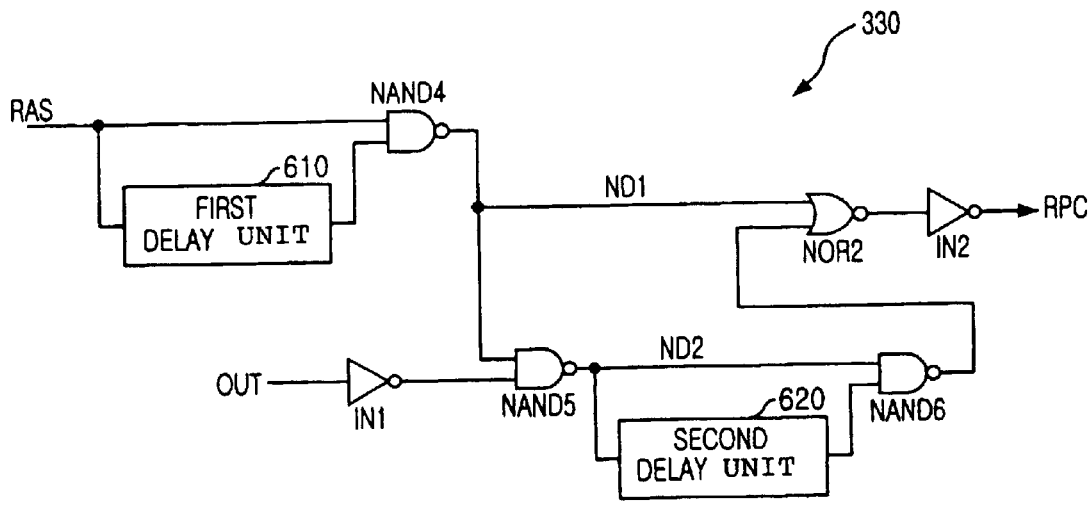
FIG. 6 is a circuit diagram of an example precharge period signal generator.

FIG. 6 is a circuit diagram of an example precharge period signal generator 330 shown in FIG. 3.

The precharge period signal generator 330 includes a first delay unit 610, a fourth NAND gate NAND4, an inverter IN1, a fifth NAND gate NAND5, a second delay unit 620, a sixth NAND gate NAND6, a second NOR gate NOR2 and an inverter IN2.

The first delay unit 610 delays the RAS signal by a predetermined time and the fourth NAND gate NAND4 receives an output of the first delay unit 610 and the RAS signal. The fifth NAND gate NAND5 receives an inverted control signal OUT from the inverter IN1 and an output of the logic gate NAND5 and the second delay unit 620 delays an output of the fifth NAND gate NAND5 by a predetermined time. The sixth NAND gate NAND6 receives outputs of the fifth NAND gate NAND5 and the second delay unit 620. The second NOR gate NOR2 receives outputs of the sixth NAND gate NAND6 and the fourth NAND gate NAND5 and the inverter IN2 receives an output of the second NOR gate NOR2 and generates the feedback signal RPC, which may be fed back to the RAS signal generator 310.

Figure 7A:
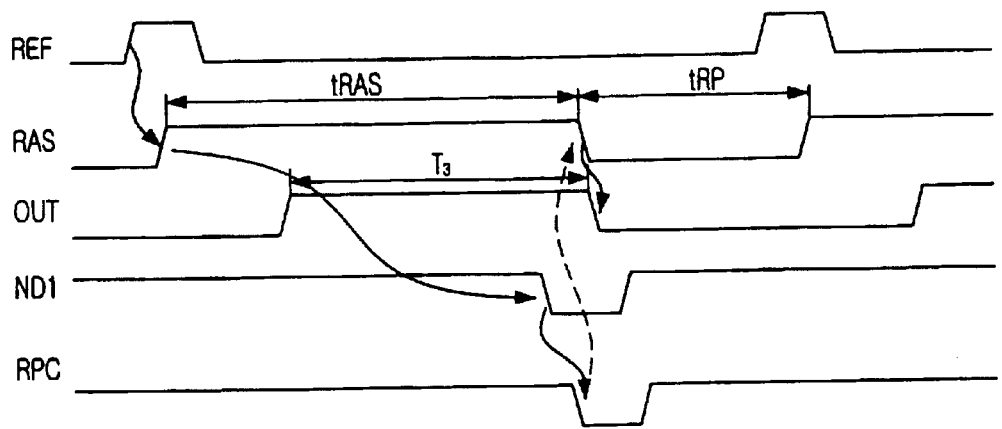
FIGS. 7A and 7B are timing diagrams illustrating an operation of the semiconductor memory device shown in FIG. 3.
Figure 7B:
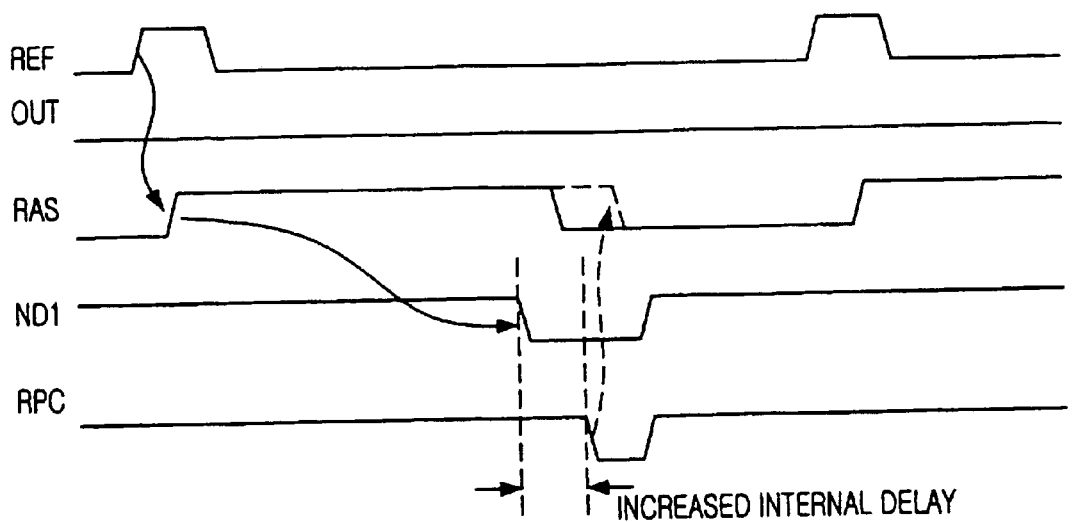

FIGS. 7A and 7B are timing diagrams illustrating an operation of the semiconductor memory device in FIG. 3 at a high temperature (e.g., at or higher than typical room temperature) and a cold temperature, respectively.

The operation of the semiconductor memory device with the temperature detecting circuit will now be explained with reference to FIGS. 3 to 7B.

First, if the RAS signal generator 310 generates the RAS signal in a high state in response to the reference signal REF changing to a high state. The precharge period signal generator 330 delays the RAS signal provided thereto by a predetermined time and generates the feedback signal RPC which is provided to the RAS signal generator 310. The RAS signal generator 310 changes the RAS signal from the high state to the low state in response to the RPC signal fed back thereto, changing to a low state which may indicate that a precharge is to begin. Subsequently, the RAS signal generator 310 changes the RAS signal from the low state to the high state in response to an enabled reference signal REF.

Since a precharge command is not typically inputted separately in an automatic refresh or self-refresh operation of a semiconductor memory device, the semiconductor memory device may be designed to operate in a precharge mode after a time required for performing a sensing operation is over.

As discussed previously, temperature may affect a required sensing time of the sense amplifier. In particular, the required sensing time may increase at a temperature lower than a room temperature, e.g., 25° C., because of increased contact resistance of the sense amplifier.

For instance, if the operational temperature of the semiconductor memory device becomes, e.g., −10° C., lower than the room temperature, the contact resistance between polysilicon and metal in the sense amplifier increases and, thus, the sensing time also increases. For such a situation, it is desired the RAS enable period of the RAS signal generator 310 be longer than that of the RAS signal generator 310 at the room temperature in order to obtain a longer sensing time. Accordingly, at the low temperature, it is required a sufficiently long time used for fully executing the sensing operation. The temperature detection circuit 320 detects a low temperature, and, thus, a RAS enable period can be appropriately extended at a low temperature compared to a room or high temperature. Therefore, a stable operation of the semiconductor memory device can be maintained at low temperatures.

Operation of the temperature detection circuit 320 will now be described. As described in FIG. 7A, at a room or high temperature, the control signal OUT is generated with a high state in a predetermined time period $T_3$ while the RAS signal is enabled. On the other hand, at a low temperature, the control signal OUT is generated with a low state as shown in FIG. 7B.

At a room or high temperature, the control signal OUT of the temperature detection circuit 320 is generated with a high state when the RAS signal is at a high state. Thus, an output of the fifth NAND gate NAND5 is at a high state. Then, the output of the sixth NAND gate NAND6 goes-to a low state signal and is inputted to the second NOR gate NOR2.

The RAS signal is outputted with a pulse type through the first delay unit 610 and the fourth NAND gate NAND4 to a node ND1. Then, the signal of the node ND1 is outputted as the feedback signal RPC via the second NOR gate NOR2 and the inverter IN2. The timing diagram of FIG. 7A corresponds to the above-described operation.

Now, an operation of the precharge period signal generator 330 will be described for a low temperature. Since the control signal OUT of the temperature detection circuit 320 is at a low state at a low temperature, the fifth NAND gate NAND5 acts as an inverter operation. The RAS signal is outputted to the node ND1 with a pulse type through the first delay unit 610 and the fourth NAND gate NAND4 and, also, the output signal of the fourth NAND gate NAND4 of the pulse type is outputted to a node ND2 inverted by the fifth NAND gate NAND5. The sixth NAND gate NAND6, receiving the output signal of the fifth NAND gate NAND5 of the pulse type and the output of the second delay unit 620 for delaying and outputting the output of the fifth NAND gate NAND5 by the predetermined delay, outputs a pulse signal having a low state only when its two input signals are at a high state at the same time.

Accordingly, when the output signal of the sixth NAND gate NAND6 becomes a low state, the pulse signal inputted to the node ND1 is then, in effect, outputted as the feedback signal RPC at a low state. Thus, the feedback signal RPC is more delayed as compared to at room or high temperature. In other words, at the low temperature, the enabled feedback signal RPC is outputted later than at the high or room temperature and, thus, the enabled period of the RAS signal becomes longer. By increasing the enabled period of the RAS signal at the low temperature, the sense amplifier moves to the precharge mode later than at the high or room temperature, so that the sense amplifier can execute its sensing operation for a sufficient amount of time. Thus, enough time is provided for performing the automatic refresh or the self-refresh operation. The timing diagram corresponding to the above-described operation is illustrated in FIG. 7B.

Figure 8:
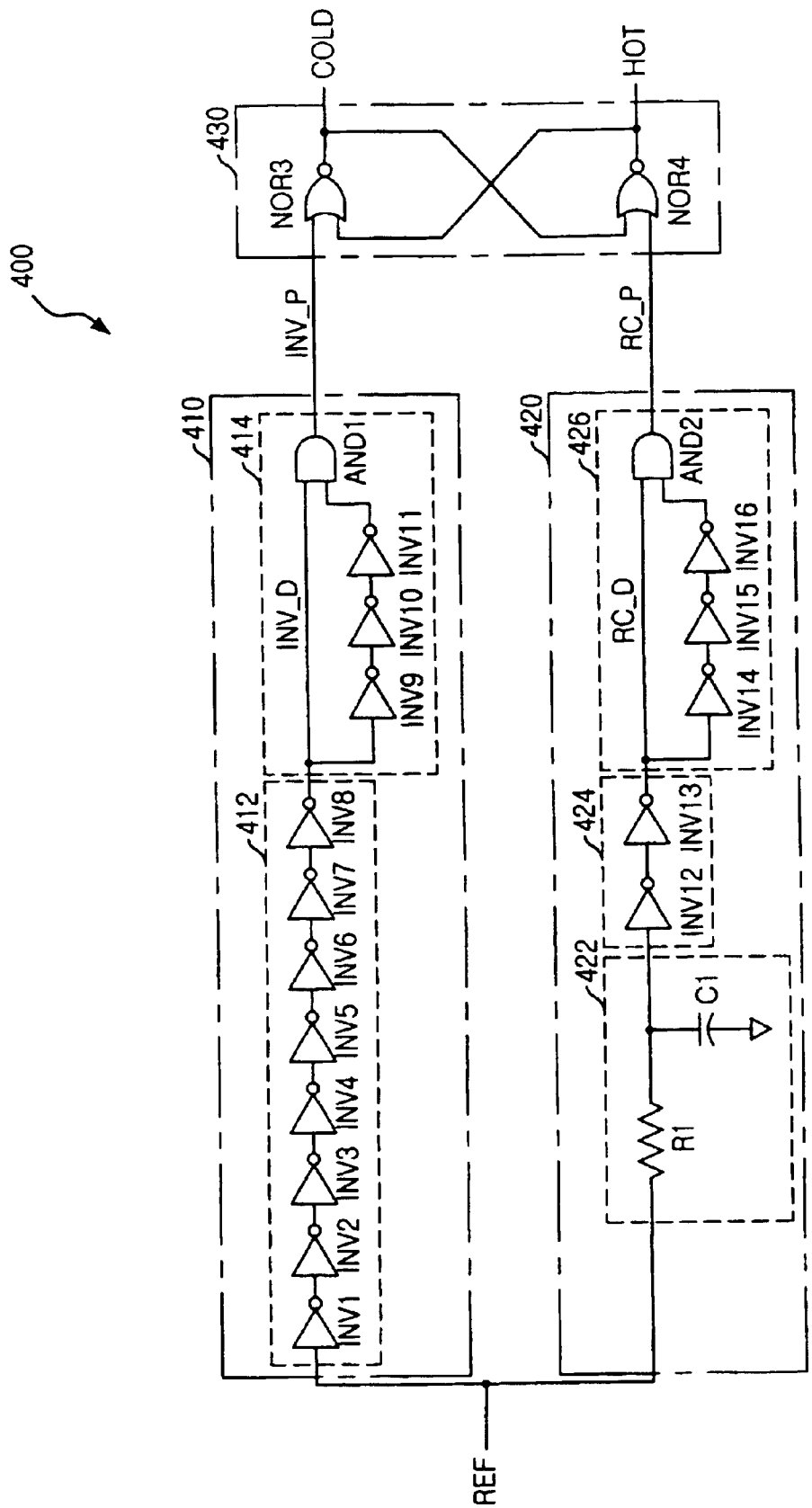
FIG. 8 is a circuit diagram of another example temperature detecting circuit.

FIG. 8 is a detailed circuit diagram of another example temperature detector 400 of FIG. 4.

The first delay unit 410 includes an inverter chain 412 for delaying the reference signal REF and generating a delayed signal INV_D, and a first pulse generating unit 414 for generating a first pulse INV_P based on the delayed signal INV_D provided from the inverter chain 412.

The inverter chain 412 includes a plurality of inverters INV1 to INV8 coupled in series.

The first pulse generating unit 414 includes a plurality of inverters INV9 to INV11 coupled in series for inverting an output of the inverter INV8, and a first AND gate AND1 for logically combining the signal INV_D and an output of the inverter INV11 to generate a first pulse INV_P.

The second delay unit 420 includes an RC delay unit 422 for delaying the reference signal REF by an RC delay value and generating a delayed input signal, a buffering unit 424 for buffering the delayed input signal from the RC delay unit 422 to produce a buffered signal RC_D, and a second pulse generating unit 426 for generating a second pulse RC_P based on the buffered signal RC_D from the buffering unit 424.

The RC delay unit 422 includes a resistor R1 for receiving the reference signal REF through a first node of the resister R1 and a capacitor C1 connected between a second node of the resistor R1 and a ground.

The buffering unit 424 includes two inverters INV12 and INV13 coupled in series, wherein an input of the inverter INV12 is coupled to the second node of the resistor R1.

The second pulse generating unit 426 comprises inverters INV14 to INV16 coupled in series that invert the buffered signal RC_D generated by from the inverter INV13, and a second AND gate AND2 for logically combining the buffered signal RC_D and an output of the inverter INV16 to generate the second pulse RC_P.

The temperature detecting unit 430 includes third and fourth NOR gates NOR3 and NOR4. The third NOR gate NOR3 receives the first pulse INV_P and an output of the fourth NOR gate NOR4 and outputs a low temperature detection signal COLD. The fourth NOR gate NOR4 receives the second pulse RC_P and the output of the third NOR gate NOR3 and outputs a high temperature detection signal HOT.

Figure 9A:
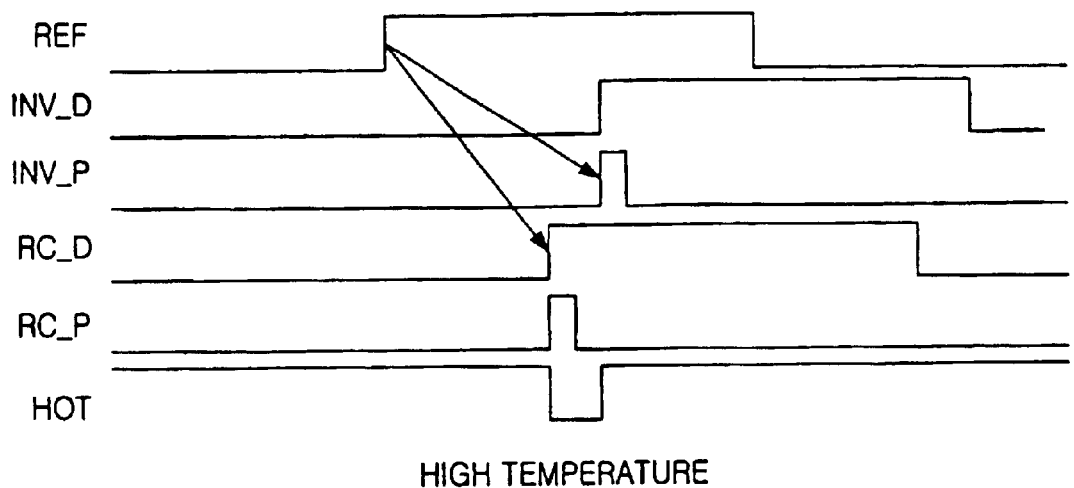
FIGS. 9A and 9B are timing diagrams illustrating an operation of the temperature detecting circuit in FIG. 8.
Figure 9B:
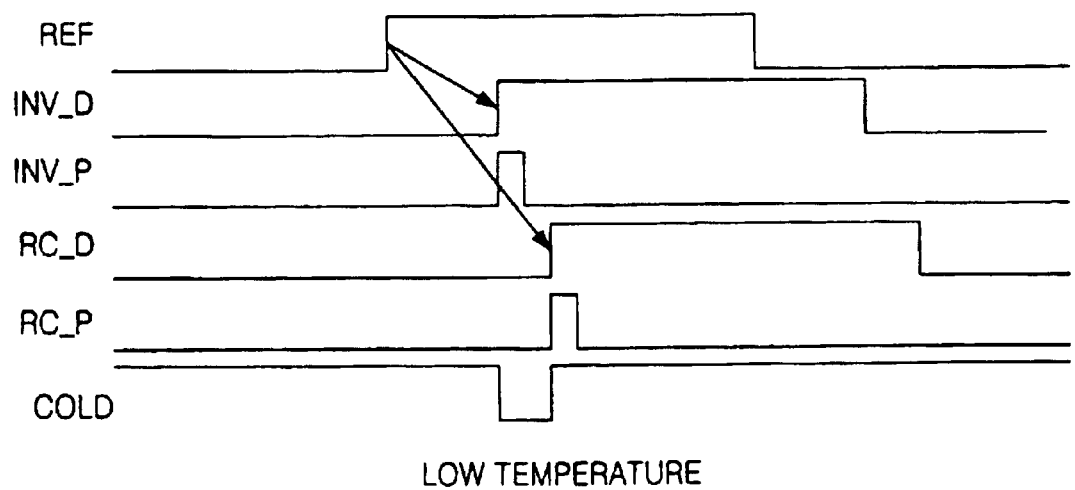

FIG. 9A is a timing diagram describing the operation of the temperature detector 400 of FIG. 8 at a high temperature and FIG. 9B is a timing diagram depicting the operation of the temperature detector 400 at a low temperature. The operation of the temperature detector 400 will now be explained in detail with reference to FIGS. 8 to 9B.

As described in FIG. 9A, at the high temperature, if the reference signal REF is provided to the temperature detector 400, the inverter chain 412 of the first delay unit 410 generates the delayed signal INV_D having a delay time to the first pulse generating unit 414, which, in turn, provides the temperature detecting unit 430 with the first pulse INV_P by based on the signal INV_D.

The RC delay unit 422 of the second delay unit 420 outputs a delayed signal having a shorter delay time than that of the delayed signal INV_D. Then, if the delayed signal outputted from the RC delay unit 422 is delivered to the second pulse generating unit 426 via the buffering unit 424, the second pulse generating unit 426 generates the second pulse RC_P based on the buffered signal RC_D from the buffering unit 424 and provides it to the temperature detecting unit 430.

At the high temperature, the first pulse INV_P whose delay time is larger than that of the second pulse RC_P is generated later than the second pulse RC_P. The delay difference between two pulses occurs because the delay operation using the inverters is more sensitive than the delay operation using the RC delay.

As a result, when the reference signal REF is in a low state, the outputs INV_P and RC_P of the first and the second pulse generating units 414 and 426 are in a low state and, at this time, assuming that the output HOT of the fourth NOR gate NOR4 and the output COLD of the third NOR gate NOR3 have a high state and a low state, respectively, the output HOT of the fourth NOR gate NOR4 goes to a low state by the second pulse RC_P generated faster than the first pulse INV_P at the high temperature and the low-transited HOT signal can be used as a high temperature detection signal.

As shown in FIG. 9B, at the low temperature, since the inverter chain 412 of the first delay unit 410 has a smaller variation in the delay time than the RC delay unit 422 of the second delay unit 420, the first pulse INV_P is generated faster than the second pulse RC_P.

Accordingly, when the reference signal REF is in a low state, in a condition in which the first and the second pulses INV_P and RC_P are in a low state and, the outputs COLD and HOT of the third and fourth logic gates NOR3 and NOR4 are in high and low states repectively, the output COLD is transited to a low state by the first pulse INV_P generated faster than the second pulse RC_P at the low temperature and the low-transited COLD can be utilized as a low temperature detection signal.

In another example, a plurality of delay units having different delay times according to a temperature variation is employed. By adjusting the delay times of the delay units, it is possible to implement a temperature detecting circuit capable of detecting various temperature levels.

Figure 10:
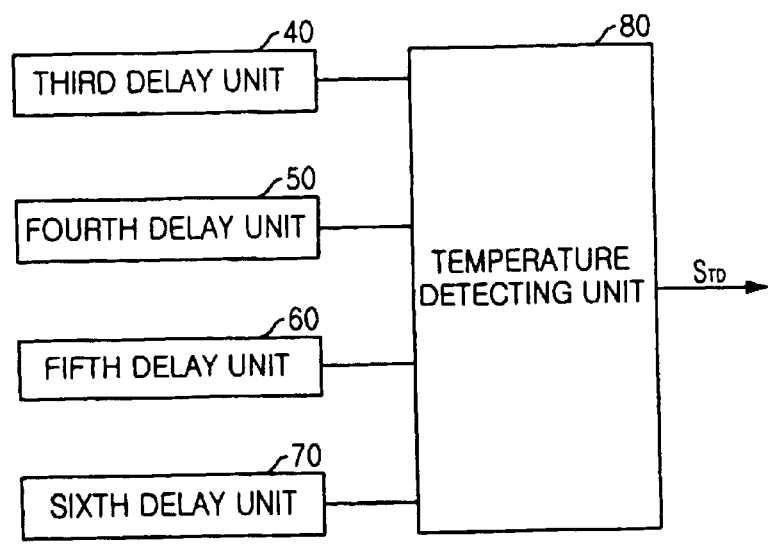
FIG. 10 is a block diagram of still another example temperature detecting circuit.

Referring to FIG. 10, there is provided a block diagram of another example temperature detector.

In FIG. 10, the temperature detector includes a third delay unit 40 comprising inverters, a fourth delay unit 50 comprising inverters and whose delay time is shorter than that of the third delay unit 40, a fifth delay unit 60 comprising an RC delay, a sixth delay unit 70 comprising an RC delay and whose delay time is shorter than that of the fifth delay unit 60, and a temperature detecting unit 80 for detecting output signals of the third to the sixth delay units 40 to 70 to generate a temperature detection signal $S_{TD}$.

Figure 11:
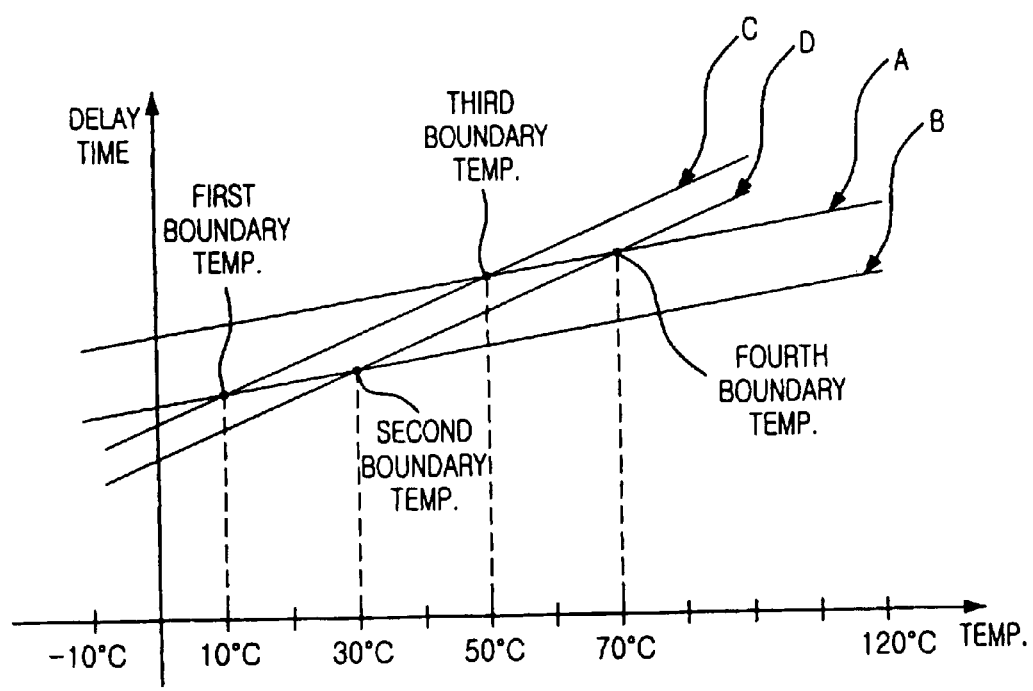
FIG. 11 is a graph illustrating delay times versus temperatures of delay units of the temperature detecting circuit shown in FIG. 10.

FIG. 11 shows a graph illustrating delay times versus temperatures for each delay unit of the temperature detector in FIG. 10. An operation of the temperature detector in FIG. 10 will now be explained with reference to FIG. 11.

In FIG. 11, lines A and B represent delay times versus temperatures of the fifth and sixth delay units 60 and 70, respectively, and lines C and D show delay times versus temperatures of the third and fourth delay units 40 an 50, respectively.

It is noted that the slopes of lines C and D of the third and fourth delay units 40 and 50 are larger than the slopes of lines A and B of the fifth and sixth delay units 60 and 70. For the lines C and D, although the slope of temperature variation of the third delay unit 40 is substantially the same as that of the fourth delay unit 50, the delay time of the third delay unit 40 is longer than that of the fourth delay unit 50 at the same temperature. Thus, the line C is located above line D. The line A is also located above line B for reasons similar to that of lines C and D. The four crossing points of the lines A to D become boundary temperatures detectable by the temperature detecting unit 80.

Using the temperature detecting circuit as described above, it is possible to detect various temperature levels.

One of ordinary skill in the art will recognize that a delay whose delay time increases as a temperature decreases, i.e., having a negative characteristic for the temperature, may also be employed in temperature detecting circuits.

Figure 12:
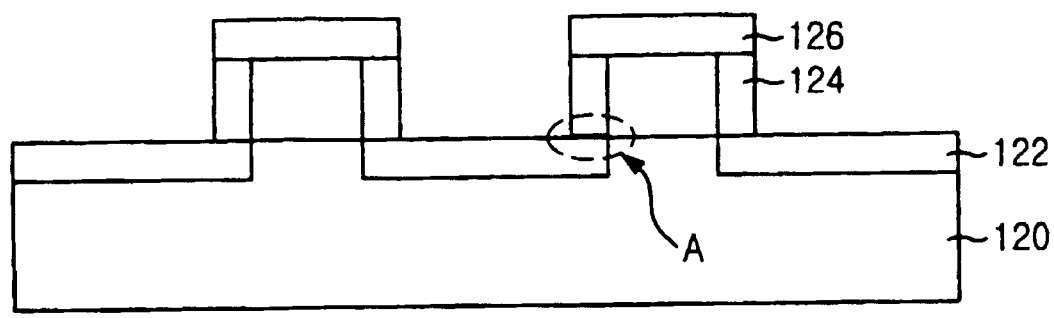
FIG. 12 is a view exemplifying a delay unit, having a negative characteristic for a temperature, that may be used in the temperature detecting circuit in FIG. 10.

FIG. 12 is a diagram of an example a delay device having the negative delay characteristic for a temperature that can be used as a delay unit.

The delay may comprise a semiconductor substrate 120, a metal line 122, a poly silicon contact plug 124 and a resistor 26 made of an impurity region formed on the substrate 1200.

A region indicated by 'A' is a junction region of the metal line 122 and the impurity region 124, which comprises a Schottky junction, so that a resistance value of the delay increases as a temperature becomes lower.

Figure 13:
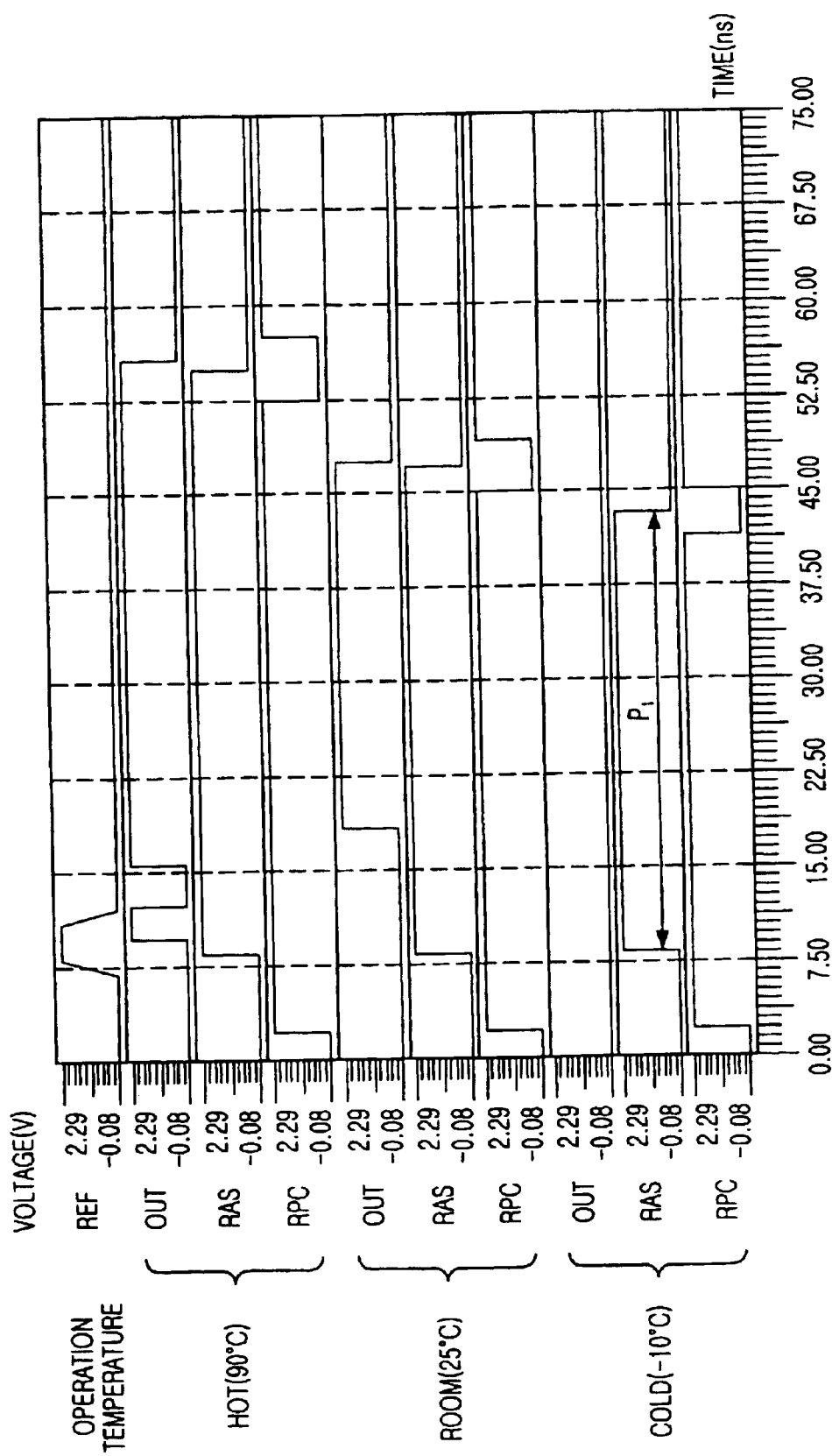
FIG. 13 is a simulation result of the operation of the semiconductor memory device in FIG. 3 when it does not employ a temperature detecting circuit.

FIG. 13 shows a simulation result of the operation of the semiconductor memory device in FIG. 3 when it does not employ the temperature detecting circuit.

FIG. 14 depicts a simulation result of the operation of the semiconductor memory device in FIG. 3 when it employs the temperature detecting circuit.

As shown, at a low temperature, e.g. −10° C., the enabled RAS signal period $P_2$ in FIG. 14 adding the temperature detecting circuit in accordance with the present invention is longer than the enabled RAM signal period $P_1$ in FIG. 13 not employing the temperature detecting circuit.

As described above, if the RAS signal enabled period is extended at a low temperature, the refresh operation can be sufficiently operated during the extended period, so that a reliable operation of the semiconductor memory device can be obtained at a low temperature. Also, since the refresh operation period is differently set according to the temperature variation, there is an effect that the whole current consumption may be reduced.

Accordingly, employing a temperature detecting circuit such as one of the examples described herein, a semiconductor memory device may improve reliability of the device.

While the present invention has been described with respect to the particular examples, it will be apparent to those skilled in the art that various changes and modifications may be made without departing from the spirit and scope of the invention as defined in the following claims.

What is claimed is:

1. A temperature detection circuit comprising:
 a first delay unit having a first delay time that varies based on a temperature, the first delay unit to receive a reference signal and to generate a first delayed reference signal;
 a second delay unit having a second delay time that varies based on the temperature, wherein the second delay time varies less than the first delay time for a given temperature variance, the second delay unit to receive the reference signal and to generate a second delayed reference signal; and
 a temperature detecting unit to receive the first and second delayed reference signals and to generate a temperature detection signal based on the first and second delayed reference signals.

2. A temperature detection circuit as recited in claim 1, wherein the first delay unit includes a plurality of inverters coupled in series.

3. A temperature detection circuit as recited in claim 1, wherein the second delay unit comprises a resistance-capacitor (RC) delay unit.

4. A temperature detection circuit as recited in claim 1, wherein the temperature detecting unit comprises first and second logic gates, the first logic gate to receive an output of the first delay unit, to receive an output of the second logic gate, and to generate an output, the second logic gate to receive an output of the second delay unit, to receive the output of the first logic gate, and to generate the output.

5. A temperature detecting circuit, comprising:
 a first delay unit having a first delay time that varies based on a temperature, the first delay unit to receive a reference signal and to generate a first delayed reference signal;
 a second delay unit having a second delay time that varies based on the temperature, the second delay unit to receive the reference signal and to generate a second delayed reference signal, wherein the second delay time is shorter than the first delay time, and wherein a variation in the second delay time for a given temperature variation is substantially the same as a variation in the first delay time for the given temperature variation;
 a third delay unit having a third delay time, that varies based on the temperature, the third delay unit to receive the reference signal and to generate a third delayed reference signal, wherein a variation in the third delay time for the given temperature variation is different than the variation in the first delay time for the given temperature variation;
 a fourth delay unit having a fourth delay time that varies based on the temperature, the fourth delay unit to receive the reference signal and to generate a fourth delayed reference signal, wherein the fourth delay time is shorter than the third delay time, and wherein a variation in the fourth delay time for the given temperature variation is substantially the same as the variation in the third delay time for the given temperature variation; and
 a temperature detecting unit for receiving the first, second, third and fourth delayed reference signals to generate a temperature detection signal based on the first to fourth delayed reference signals.

6. A temperature detection circuit as recited in claim 5, wherein the first delay time of the first delay increases as a temperature increases.

7. A temperature detection circuit as recited in claim 5, wherein the first delay unit comprises a junction region between a metal line and an impurity region.

8. The temperature detection circuit as recited in claim 5, wherein the first delay unit includes a plurality of inverters coupled in series.

9. A temperature detection circuit as recited in claim 5, wherein the third delay unit comprises a RC delay unit.

10. A semiconductor memory device comprising a temperature detection circuit to generate a temperature detection signal, wherein the temperature detection circuit includes:

a first delay unit having a first delay time that varies based on a temperature, the first delay unit to receive a reference signal and to generate a first delayed reference signal;

a second delay unit having a second delay time that vanes based on the temperature, the second delay unit to receive the reference signal and to generate a second delayed reference signal, wherein the second delay time varies leas than the first delay time for a given temperature variance; and a temperature detecting circuit to receive the first and second delayed reference signals and to generate the temperature detection signal based on the first and second delayed reference signals.

11. A semiconductor memory device as recited in claim 10, wherein the temperature detection circuit further comprises a detection signal generator to receive the temperature detection signal, to receive the reference signal, and to generate a first control signal, the semiconductor memory device further comprising:

a row address strobe (RAS) signal generator to generate a RAS signal based on the reference signal and feed back signal; and a precharge period signal generator to generate the feedback signal in response to the first control signal and the RAS signal, wherein a delay time for activating the feed back signal is increased when an operational temperature is lower than a reference temperature.

12. A semiconductor memory device as recited in claim 10, wherein the first delay includes a plurality of inverters coupled in series.

13. A semiconductor memory device as recited in claim 10, wherein the second delay comprises a resistance-capacitor (RC) delay unit.

14. A semiconductor memory device as recited in claim 10, wherein the temperature detecting unit comprises first and second logic gates) the first logic gate to receive an output of the first delay unit, to receive an output of the second logic gate, and to generate an output, the second logic gate to receive an output of the second delay unit, to receive the output of the first logic gate, and to generate the output.

15. A semiconductor memory device as recited in claim 11, wherein the detection signal generator further includes:

a first inverting unit having a plurality of inverters coupled in series to receive the first delayed reference signal; and a first NAND gate to receive an output of the first inverting unit and the reference signal and to generate a second control signal.

16. A semiconductor memory device as recited in claim 15, wherein the second delay includes:

a second inverting unit having a plurality of inverters coupled in series; and a plurality of MOS transistors, each coupling an output of a corresponding one of the plurality of inverters to a supply voltage or a ground, and having a gate coupled to an output of a corresponding next inverter.

17. A semiconductor memory device as recited in claim 16, wherein the temperature detecting unit comprises first and second logic gates, the first logic gate to receive an output of the first delay unit, to receive an output of the second logic gate, and to generate an output, the second logic gate to receive an output of the second delay unit, to receive the output of the first logic gate, and to generate the output.

18. The semiconductor memory device as recited in claim 16, wherein the detection signal generating unit further comprises:

a transfer gate to transfer the temperature detection signal in response to the second control signal;

a latch to receive an output of the transfer gate;

a NOR gate to receive an output of the latch and an inverted RAS signal; and a buffering unit including two inverters, the buffering unit to receive an output signal of the NOR gate and to generate the first control signal.

19. The semiconductor memory device as recited in claim 18, wherein the precharge period signal generator includes:

a pulse generating unit to receive the RAS signal and to generate a pulse signal;

a second NAND gate to receive an inverted first control signal and the pulse signal;

a delay unit to delay an output of the second NAND gate by a predetermined time;

a third NAND gate to receive outputs of the second NAND gate and the delay unit;

a second NOR gate to receive outputs of the third NAND gate and the pulse signal; and a third inverter for inverting an output of the second NOR gate to generate the feedback signal.

* * * * *

UNITED STATES PATENT AND TRADEMARK OFFICE
CERTIFICATE OF CORRECTION

PATENT NO. : 6,735,137 B2
DATED : May 11, 2004
INVENTOR(S) : Jung et al.

It is certified that error appears in the above-identified patent and that said Letters Patent is hereby corrected as shown below:

<u>Title page,</u>
Item [75], Inventors, after "In-Chul Jung," please delete "Ichon-shi" and insert -- Kyoungki-do -- in its place and after "Sun-Seok Yang," please delete "Ichon-shi" and insert -- Kyoungki-do -- in its place.

<u>Column 11,</u>
Line 12, after "time varies," please delete "leas" and insert -- less -- in its place.
Line 41, after "and second logic," please delete "gate)" and insert -- gate, -- in its place.

Signed and Sealed this

Twenty-third Day of November, 2004

JON W. DUDAS
*Director of the United States Patent and Trademark Office*